United States Patent [19]

Kamuro et al.

[11] Patent Number: 4,775,990
[45] Date of Patent: Oct. 4, 1988

[54] SERIAL-TO-PARALLEL CONVERTER

[75] Inventors: Setsufumi Kamuro, Yamatokoriyama; Akira Yamaguchi, Nara, both of Japan

[73] Assignee: Sharp Kabushiki Kaisha, Osaka, Japan

[21] Appl. No.: 107,847

[22] Filed: Oct. 6, 1987

Related U.S. Application Data

[63] Continuation of Ser. No. 691,268, Jan. 14, 1985.

[30] Foreign Application Priority Data

Jan. 18, 1984 [JP] Japan .............................. 59-5458[U]

[51] Int. Cl.⁴ .............................................. G11C 7/00
[52] U.S. Cl. ...................................... 377/77; 377/80; 377/70; 365/219
[58] Field of Search ...................... 377/75, 77, 78, 79, 377/80, 64, 54, 68, 69, 70, 74; 328/105, 153; 365/219

[56] References Cited

U.S. PATENT DOCUMENTS

| | | | |
|---|---|---|---|
| 2,951,230 | 8/1960 | Cadden | 377/80 |
| 3,305,738 | 2/1967 | Kintner | 377/69 |
| 3,743,858 | 7/1973 | Woods | 377/77 |
| 3,972,034 | 7/1976 | Derickson, III et al. | 377/67 |
| 4,063,119 | 12/1977 | Odell et al. | 307/290 |
| 4,250,406 | 2/1981 | Alaspa | 377/79 |
| 4,387,294 | 6/1983 | Nakamura et al. | 377/78 |
| 4,396,829 | 8/1983 | Sugihara et al. | 377/54 |
| 4,429,300 | 1/1984 | Yamasawa et al. | 377/64 |
| 4,441,198 | 4/1984 | Shibata et al. | 377/78 |
| 4,581,740 | 4/1986 | Kinoshita | 377/54 |

OTHER PUBLICATIONS

"Deserializer", p. 653, IBM Technical Disclosure Bulletin, vol. 14, No. 2, Jul. 1971.

Primary Examiner—John S. Heyman
Attorney, Agent, or Firm—Flehr, Hohbach, Test, Albritton & Herbert

[57] ABSTRACT

A serial-to-parallel converter has a number of memory cells connected in series for successively shifting input data in synchronism with a shift clock. The content of each memory cell is transferred by a latch circuit. The memory cells are provided with input terminals so that they can be set to "1" or "0" simultaneously before the entry of input data. This resetting, or presetting, reduces the number of reversals of the output polarity of the memory cells and hence the power consumed by the circuit can be diminished.

5 Claims, 3 Drawing Sheets

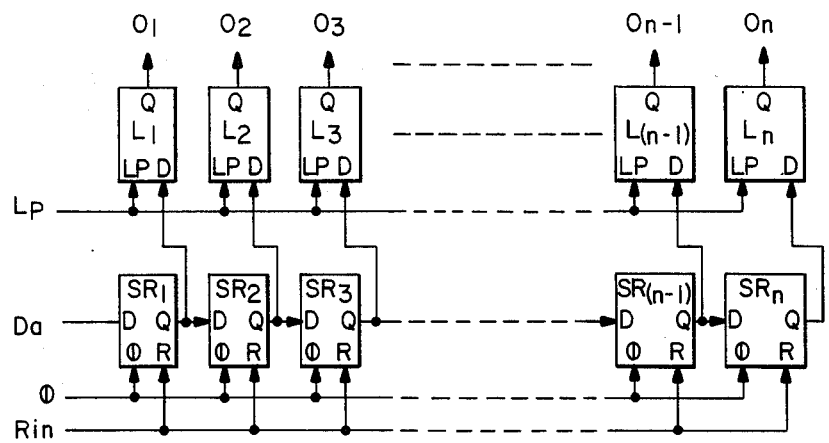
FIG. — 1a
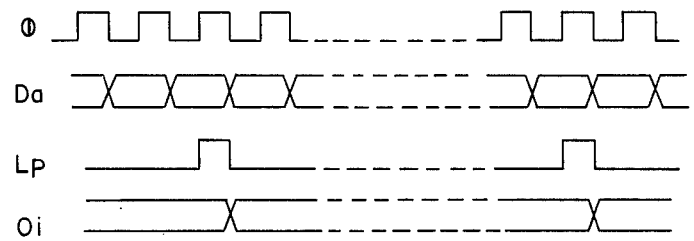
FIG. — 1b
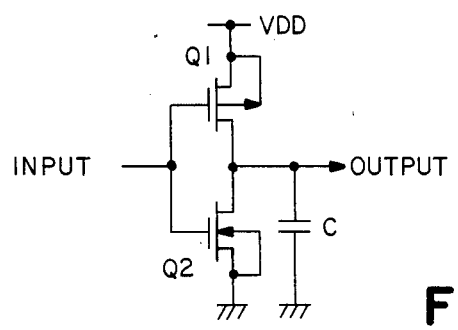
FIG. —3

| INITIAL STATE | 0 | 1 | 0 | 1 |
| INITIAL STATE | 1 | 1 | 1 | 1 |
| RESET | 0* | 0* | 0* | 0* |
| | 1* | 0* | 1* | 0* | CLOCK NO. 1 | 1* | 0 | 0 | 0 |
| | 0* | 1* | 0* | 1* | CLOCK NO. 2 | 0* | 1* | 0 | 0 |
| | 1* | 0* | 1* | 0* | CLOCK NO. 3 | 1* | 0* | 1* | 0* |
| | 0* | 1* | 0* | 1* | CLOCK NO. 4 | 0* | 1* | 0* | 1* |
FIG.—2a      FIG.—2b
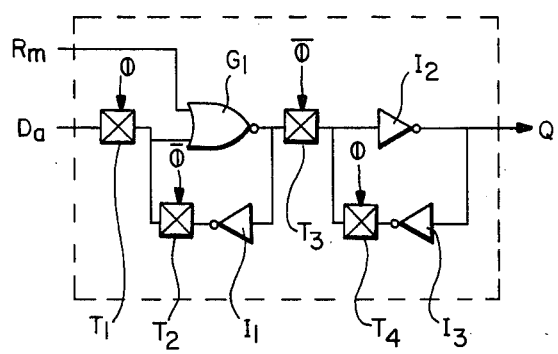
FIG.—4

INITIAL STATE 
PRESET 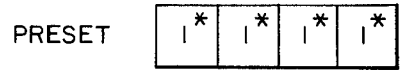
CLOCK NO. 1 
CLOCK NO. 2 
FIG. —5
CLOCK NO. 3 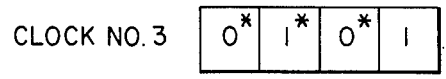
CLOCK NO. 4 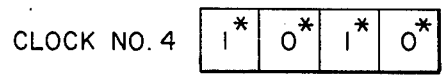
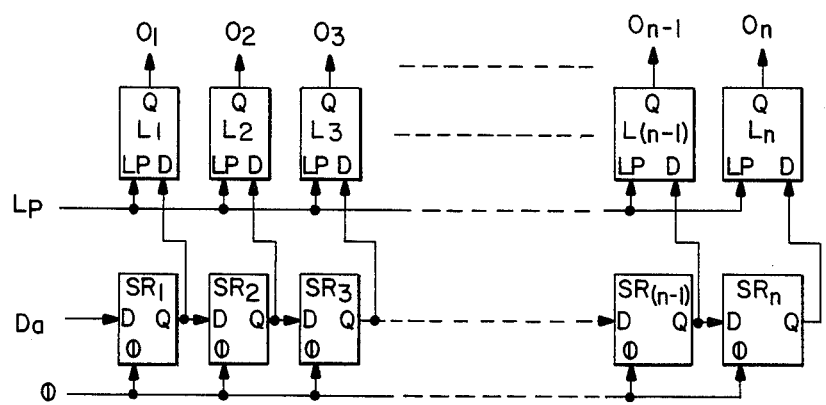
FIG. —6a  PRIOR ART
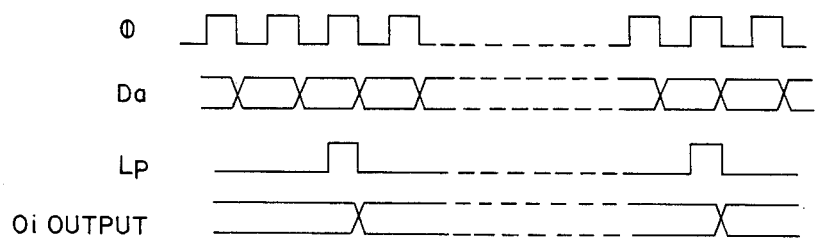
FIG. —6b  PRIOR ART

SERIAL-TO-PARALLEL CONVERTER

This is a continuation of application Ser. No. 691,268 filed Jan. 14, 1985.

BACKGROUND OF THE INVENTION

This invention relates to an improved serial-to-parallel converter which uses shift registers and latch circuits and in particular to a serial-to-parallel converter composed of CMOS transistor circuits.

There is shown in FIG. 6(a) a conventional type of serial-to-parallel converter wherein n memory cells (or bit stages) SR1 to SRn are connected in series and successively shift the input serial data Da in synchronism with a shift clock $\phi$. A latch pulse $L_P$ is generated when the data Da inputted at the first memory cell SR1 finally reach the last memory cell SRn. The output data from the memory cells are latched to the n latch circuits $L_1$ to $L_n$ to generate output signals $O_1$ to $O_n$, thus completing the serial-to-parallel conversion. New serial data are inputted thereafter from the first memory cells SR1 and the same process is repeated. FIG. 6(b) shows the operation timing signals of the circuit of FIG. 6(a).

With a circuit structure as shown in FIG. 6(a), however, a shift register may reverse its polarity by the input of shift clock $\phi$ even before the input serial data are transmitted, depending upon the initial state of the shift register. Such reversals in memory cells result in a waste of power. When the circuit is made of CMOS transistors, in particular, the primary advantage of using CMOS circuits may not be fully utilized.

It is therefore an object of this invention to eliminate such problems of a conventional circuit of this type and to reduce the number of reversals, thereby providing a serial-to-parallel converter with a reduced rate of power consumption.

BRIEF DESCRIPTION OF THE DRAWINGS

FIGS. 1a and 1b is a block diagram of a circuit according to an embodiment of this invention and its time chart.

FIGS. 2a and 2b compares the operation of the circuit of FIG. 1 and a circuit of the conventional design for the case of a 4-bit shift register.

FIG. 3 is a CMOS circuit according to the present invention.

FIG. 4 is a block diagram of a shift register according to another embodiment of the present invention.

FIG. 5 shows another mode of operation according to the present invention.

FIGS. 6a and 6b is a block diagram and a time chart of a conventional serial-to-parallel converter.

DETAILED DESCRIPTION OF THE INVENTION

FIG. 1(a) is a serial-to-parallel converter according to an embodiment of this invention and FIG. 1(b) shows an example of its action timing. There are n memory cells SR1 to SRn connected in series which successively shift the input serial data Da in synchronism with shift clock $\phi$. A latch pulse $L_P$ is generated when the data Da inputted at the first memory cell SR1 finally reach the last memory cells SRn. The output data from the memory cells SR1 to SRn are latched to the n latch circuits $L_1$ to $L_n$ to generate parallel output signals $O_1$ to $O_n$ corresponding to the input serial data Da. The operations up to this point therefore are the same as in the conventional converter discussed above.

According to this invention, however, all memory cells SR1 to SRn have a reset terminal R through which a reset input $R_{in}$ is simultaneously given to the memory cells SR1 to SRn to reset their contents to "0" after the latching operation mentioned above. After a reset, serial data can be entered again from the first memory cells SR1 for effecting serial-to-parallel conversion. Similar effects can be obtained if they are all set to "1" instead of "0."

If the memory cells SR1 to SRn are set to "0" or "1" prior to the input of the serial data as shown above, the reversal frequency of output data polarity can be reduced. If one now considers the bit SRn of FIG. 1(a), the output of memory cell SRn remains "0" against the first (n−1) clock pulse $\phi$ after a reset and the possibility of change from "0" to "1" becomes nonzero only by the nth clock pulse. Similarly, the output of the memory cell SRn−1 remains "0+ for the first (n−2) clock pulses after a reset, having a possibility of output data reversal only by the (n−1)st and nth clock pulses.

This is how the frequency of reversals of the polarity of output data can be reduced. In order to explain this mechanism more clearly, there is shown in FIG. 2 an example with a 4-bit shift register. FIG. 2(a) represents the case of a conventional circuit where the initial value is 0101. Each time a shift clock pulse is entered, changes take place one bit at a time and a completely new 4-bit output appears in the memory cells after four clock pulses. In this situation, the output of each memory cell is changed at each shift clock pulse and there are altogether 16 reversals. FIG. 2(b), on the other hand, represents a case of the present invention where the initial value is 1111. After a reset, this changes to 0000. It changes thereafter one bit at a time as before and a new 4-bit output appears in the shift registers after four clock pulses. Symbol * indicates a bit where the polarity change takes place. Thus, there are altogether 14 reversals in this case.

In the case of a shift register with n bits, in summary, there are $n^2$ reversals if a conventional circuit is used to completely rewrite the data in all bits. By a circuit according to the present invention, this becomes $n(n+1)/2+n=(n^2+3n)/2$ and it is always smaller than $n^2$ if n is greater than 3. If n is significantly greater than 3, the number of reversals according to the present invention becomes approximately one-half of the conventional case.

The power loss in a CMOS circuit is generally determined by the charging and discharging of the load. In the case of a circuit shown in the FIG. 3, wherein $Q_1$ is a p-channel MOS transistor, $Q_2$ is an n-channel transistor, C is the load capacitance and $V_{DD}$ is the source voltage. In this case, power consumption P is given by $P=CV_{DD}f$ where f is the number of reversals of output polarity per unit time. When all data in memory cells are rewritten in a unit time, therefore, the difference in the number of reversing the bits, as discussed before, directly becomes the difference in power consumption. In summary, the serial-to-parallel converter of this invention can reduce the power consumption if n is greater than 3, making it about one-half of the value where a conventional circuit is used if n is much greater than 3.

According to another embodiment of the invention, the memory cells SR2 to SRn (other than the first one) can be formed as shown in FIG. 4 as a circuit containing a NOR gate $G_1$, inverters $I_1$, $I_2$ and $I_3$, and transmission gates $T_1$ to $T_4$ and having data $D_a$ and a reset signal $R_{in}$ as inputs. The transmission gates $T_1$ to $T_4$ each function as a switch which changes to "ON" by a shift clock $\phi$ or $\overline{\phi}$. As for the first memory cell to be used together with this circuit, if a flip-flop without the reset facility (such as the circuit of FIG. 4 with the NOR gate replaced by an inverter and an $R_{in}$ removed or that with "0" entered as $R_{in}$) is used for this purpose, the latch pulse itself can be used as the reset signal for the memory cell, obviating the necessity of generating a reset signal separately.

It now goes without saying that the reset in the above embodiments can be replaced by a preset by "1" to obtain an identical effect. An example in the case of a 4-bit shift register is shown in FIG. 5 so that a comparison may be made with FIG. 2(b).

In summary, the number of reversals of output polarity of memory cells can be reduced significantly merely by attaching simple structures to a conventional serial-to-parallel converter. The rate of power consumption can be reduced accordingly and the advantage of using CMOS transistors in such a converter can be fully realized.

What is claimed is:

1. A serial-to-parallel converter consisting solely of no more than a specified number n of memory cells connected in series and adapted to successively shift input data therethrough in synchronism with a shift clock, and n latch circuits individually interconnected with said memory cells with means connected to said latch circuits to receive a latch signal so that application of said latch signal to said latch circuits alone causes the contents of said memory cells to be individually transferred to said latch circuits, said memory cells being provided with input terminals through which said memory cells directly receive a signal for setting or resetting said memory cells together before said input data are entered.

2. The serial-to-parallel converter of claim 1 wherein said memory cells comprise CMOS transistors.

3. The serial-to-parallel converter of claim 1 wherein output signals from said converter are unaffected by said shift clock.

4. The serial-to-parallel converter of claim 1 wherein each of said memory cells has a clock pulse terminal through which clock signals from said shift clock is received.

5. The serial-to-parallel converter of claim 1 wherein said latch circuits output the contents thereof in parallel.

* * * * *